United States Patent
Robbins et al.

(10) Patent No.: US 11,330,746 B2
(45) Date of Patent: May 10, 2022

(54) DEVICE AND METHOD FOR REWORKING FLIP CHIP COMPONENTS

(71) Applicant: Raytheon Company, Waltham, MA (US)

(72) Inventors: James A. Robbins, Groton, MA (US); Jeffrey A. Shubrooks, South Boston, MA (US)

(73) Assignee: Raytheon Company, Waltham, MA (US)

( * ) Notice: Subject to any disclaimer, the term of this patent is extended or adjusted under 35 U.S.C. 154(b) by 327 days.

(21) Appl. No.: 16/286,947

(22) Filed: Feb. 27, 2019

(65) Prior Publication Data

US 2019/0269050 A1 Aug. 29, 2019

Related U.S. Application Data

(60) Provisional application No. 62/636,319, filed on Feb. 28, 2018.

(51) Int. Cl.
*H05K 13/04* (2006.01)
*H05K 3/34* (2006.01)
(Continued)

(52) U.S. Cl.
CPC ....... *H05K 13/0486* (2013.01); *H01L 21/563* (2013.01); *H01L 24/75* (2013.01);
(Continued)

(58) Field of Classification Search
CPC .............. H05K 3/3436; H05K 3/3494; H05K 13/0486; H01K 2203/176; H01L 21/563;
(Continued)

(56) References Cited

U.S. PATENT DOCUMENTS 5,172,469 A 12/1992 Onda et al.
5,355,580 A * 10/1994 Tsukada ................ H01L 21/563
174/260

(Continued)

FOREIGN PATENT DOCUMENTS

EP 0548603 9/1995
JP 2005 197621 7/2005
(Continued)

OTHER PUBLICATIONS

International Search Report and Written Opinion for corresponding International Patent Application No. PCT/US2019/019731 dated May 27, 2019.

(Continued)

*Primary Examiner* — Carl J Arbes
(74) *Attorney, Agent, or Firm* — Renner, Otto, Boisselle & Sklar, LLP

(57) ABSTRACT

A system and method for reworking a flip chip includes use of a mill to remove an old flip chip, and a pick-and-place device for putting a new flip chip in place at the same location. The process may be automated, with the removal and the placement occurring sequentially without need for operator intervention. Other devices and processes may be part of the system/machine and process, for example cleaning following the milling, fluxing prior to the placement, and heating to cause solder reflow, to secure the new flip chip in place. Underfill may be employed to make for a more mechanically robust mounting of the new flip chip.

14 Claims, 3 Drawing Sheets

(51) Int. Cl.
*H01L 23/00* (2006.01)
*H01L 21/56* (2006.01)

(52) U.S. Cl.
CPC ............ *H01L 24/799* (2013.01); *H01L 24/81* (2013.01); *H01L 24/92* (2013.01); *H01L 24/98* (2013.01); *H05K 3/3436* (2013.01); *H05K 3/3494* (2013.01); H01L 24/13 (2013.01); H01L 24/16 (2013.01); H01L 24/32 (2013.01); H01L 24/83 (2013.01); H01L 2224/131 (2013.01); H01L 2224/16227 (2013.01); H01L 2224/32225 (2013.01); H01L 2224/73204 (2013.01); H01L 2224/7501 (2013.01); H01L 2224/7525 (2013.01); H01L 2224/75702 (2013.01); H01L 2224/75901 (2013.01); H01L 2224/812 (2013.01); H01L 2224/814 (2013.01); H01L 2224/81011 (2013.01); H01L 2224/8122 (2013.01); H01L 2224/81193 (2013.01); H01L 2224/81815 (2013.01); H01L 2224/83104 (2013.01); H01L 2224/92125 (2013.01); H01L 2224/92143 (2013.01); H01L 2224/98 (2013.01); H01L 2924/14 (2013.01); H05K 2203/176 (2013.01)

(58) Field of Classification Search
CPC ......... H01L 24/13; H01L 24/16; H01L 24/32; H01L 24/75; H01L 24/799; H01L 24/81; H01L 24/83; H01L 24/92; H01L 2924/14; H01L 2224/7525; H01L 2224/92143; H01L 2224/81815; H01L 2224/83104; H01L 2224/73204; H01L 2224/814; H01L 2224/75702; H01L 2224/16227; H01L 2224/812; H01L 2224/92125; H01L 2224/8122; H01L 2224/98; H01L 2224/75901; H01L 2224/32225; H01L 2224/7501; H01L 2224/81011
See application file for complete search history.

(56) References Cited

U.S. PATENT DOCUMENTS

| 5,542,601 | A | 8/1996 | Fallon et al. | |
|---|---|---|---|---|
| 6,681,038 | B2 * | 1/2004 | Vilella | G01R 31/309 382/145 |
| 7,781,232 | B2 * | 8/2010 | Arvin | H01L 21/563 438/4 |
| 8,492,171 | B2 * | 7/2013 | Deschenes | H01L 23/49811 438/4 |
| 9,221,114 | B2 * | 12/2015 | Chen | C22B 3/04 |
| 2009/0184407 | A1 | 7/2009 | Arvin | |
| 2010/0187732 | A1 * | 7/2010 | Inuma | B23K 3/08 266/227 |
| 2012/0141219 | A1 | 6/2012 | Simons | |
| 2014/0183718 | A1 * | 7/2014 | Han | H01L 21/561 257/692 |

FOREIGN PATENT DOCUMENTS

| KR | 1020100006830 | A | * | 1/2010 |
|---|---|---|---|---|
| TW | 200304197 | A | | 9/2003 |
| TW | 201736022 | A | | 10/2017 |
| WO | 2001097278 | | | 12/2001 |
| WO | 03058708 | A1 | | 7/2003 |
| WO | 2017/044470 | | | 3/2017 |
| WO | 120815 | A1 | * | 7/2017 |
| WO | 143499 | | * | 8/2017 |

OTHER PUBLICATIONS

Taiwanese Examination Report for corresponding application TW 108106812 dated Dec. 2, 2020.
IC-Production Cells, distributed by Air-Vac Automation, [online], [retrieved on Feb. 27, 2019]. Retrieved from Internet, <URL: http://www.air-vac-automation.com/IC-Series.html>.
Moore et al.; "Reworking Underfilled Flip Chips", US Tech, Jul./Aug. 2000, Retrieved from Internet, <URL: https://www.semicorp.com/articles/published-articles/item/reworking-underfilled-flip-chips>.

* cited by examiner

DEVICE AND METHOD FOR REWORKING FLIP CHIP COMPONENTS

This application claims priority to U.S. Provisional Application 62/636,319, filed Feb. 28, 2018, which is incorporated by reference in its entirety.

FIELD OF THE INVENTION

The invention is in the field of devices and methods for removing and replacing semiconductor chips on electronic assemblies.

DESCRIPTION OF THE RELATED ART

U.S. Pat. No. 5,542,601 describes prior art approaches related to mounting of semiconductor chips ("chips") on electronic devices.

One method for packaging a semiconductor integrated circuit device (hereinafter referred to as a semiconductor chip or just chip) involves attaching solder balls to contact pads on the circuit-bearing surface of the chip. These solder balls have compositions which include, for example, 97% (by weight) Pb and 3% (by weight) Sn, with the corresponding melting temperature being 320 degrees C. This chip is then placed face-down, in the so-called flip chip configuration, onto a ceramic, e.g., alumina, substrate, with the solder balls being placed onto solderable metal contact pads on the ceramic substrate. Sufficient heat is then applied to melt the solder balls. Upon cooling and re-solidification, the solder balls serve to mechanically and electrically connect the chip to the ceramic substrate, resulting in what is commonly referred to as a ceramic chip carrier. The ceramic chip carrier is then mounted onto a printed circuit board (PCB) or printed circuit card (PCC) using, for example, a lead frame.

Another method for packaging a semiconductor chip involves mounting the chip, in the flip chip configuration, directly onto a PCB or PCC, which is conventionally comprised of organic materials such as the epoxy resin/fiberglass compositions sold under the trade names FR4 and DriClad, as well as polytetrafluoroethylene (PTFE)-based materials. As before, solder balls are attached to contact pads on the circuit-bearing surface of the chip, the solder balls having compositions which include, for example, 97% (by weight) Pb and 3% (by weight) Sn. Again as before, the solder balls attached to the chip are to be attached to corresponding solderable metal contact pads on the PCB or PCC. However, in this instance, such attachment is not achieved by melting the solder balls because the organic materials comprising the PCB or PCC are incapable of withstanding the temperatures needed to achieve solder ball melting. Rather, a region of Pb—Sn solder having the eutectic composition, i.e., 63% (by weight) Pb and 37% (by weight) Sn, is first applied to each solderable metal contact pad on the PCB or PCC. The solder balls attached to the chip are then brought into contact with the eutectic solder on the PCB or PCC, and tile eutectic solder is then heated to its melting temperature of 183 degrees C., which has no adverse effects on the organic materials comprising the PCB or PCC. Upon cooling and re-solidification, the eutectic solder serves to mechanically and electrically connect the solder balls on the chip to the contact pads on the PCB or PCC.

These are only examples of chip-mounting processes. A difficulty arises when it is desired that a defective chip be replaced, a process known as reworking. Avoiding reworking can result in a need to discard expensive devices, while attempting reworking can be expensive and/or time-consuming, and can result in damage to the electronic device, rendering the device unusable or necessitating difficult repair operations.

SUMMARY OF THE INVENTION

A system and method for reworking a flip chip mounting on an electronic device involves using a mill to remove the chip, and replacing the chip with a new chip in the milled area.

According to an aspect of the invention, a method of reworking an underfilled flip chip mounted on an electronic device includes the steps of: milling away the flip chip and underfill around the flip chip; and following the milling, mounting a new flip chip in place of the flip chip that was removing by the milling.

According to an embodiment of any paragraph(s) of this summary, the milling makes available for mounting conductive pads of the electronic device.

According to an embodiment of any paragraph(s) of this summary, the milling uses an end mill.

According to an embodiment of any paragraph(s) of this summary, the milling comes within 1-10 mils of the conductive pads.

According to an embodiment of any paragraph(s) of this summary, the milling comes within 1 mil, or about 1 mil, of the conductive pads.

According to an embodiment of any paragraph(s) of this summary, the milling exposes solder on top of the conductive pads, wherein the exposed solder was used to electrically couple the original flip chip to the conductive pads.

According to an embodiment of any paragraph(s) of this summary, the milling removes conductive connections, such as solder, for example from solder balls, between the flip chip and the conductive pads.

According to an embodiment of any paragraph(s) of this summary, the method further includes, following the milling and preceding the mounting, cleaning debris from the milling.

According to an embodiment of any paragraph(s) of this summary, the method further includes, preceding the mounting, placing flux on the new flip chip.

According to an embodiment of any paragraph(s) of this summary, the placing the flux includes flux dipping.

According to an embodiment of any paragraph(s) of this summary, the mounting includes placing the new flip chip.

According to an embodiment of any paragraph(s) of this summary, the placing includes placing with a pick-and-place device.

According to an embodiment of any paragraph(s) of this summary, the mounting includes, following the placing, reflowing solder to make an electrical connection between the new flip chip and the conductive pads.

According to an embodiment of any paragraph(s) of this summary, the reflowing includes heating with a heater.

According to an embodiment of any paragraph(s) of this summary, the method further includes, following the mounting, placing underfill around the new flip chip.

According to an embodiment of any paragraph(s) of this summary, some or all of the operations are performed in a single machine or system.

According to an embodiment of any paragraph(s) of this summary, the single machine or system aligns/places the electronic device relative to operative parts of the machine or system that perform some or all of the functions.

According to an embodiment of any paragraph(s) of this summary, the machine or system enables relative movement between the electronic device and the operative parts.

According to another aspect of the invention, a machine or system for reworking an underfilled flip chip mounted on an electronic device, includes: a mill; and a chip placer. The mill and the chip placer are operatively coupled so as to mill and place a new flip chip in the same location on the electronic device.

According to an embodiment of any paragraph(s) of this summary, the machine or system performs any of the operation(s) of any of the method step(s) of any paragraphs) of this summary.

According to an embodiment of any paragraph(s) of this summary, the mill is an end mill.

According to an embodiment of any paragraph(s) of this summary, the mill is a precision mill.

According to an embodiment of any paragraph(s) of this summary, the chip placer is a pick-and-place device.

According to an embodiment of any paragraph(s) of this summary, the machine or system further includes an aligner operatively coupled to the mill and the chip placer.

According to an embodiment of any paragraph(s) of this summary, the aligner aligns the electronic device relative to the mill, the chip placer, and/or other operative parts of the machine or system.

According to an embodiment of any paragraph(s) of this summary, the machine or system further includes a cleaner for cleaning debris left by operation of the mill.

According to an embodiment of any paragraph(s) of this summary, the machine or system further includes a heater, for heating to couple the new flip chip to the electronic device.

According to an embodiment of any paragraph(s) of this summary, the machine or system further includes a bed to which the electronic device is secured.

According to an embodiment of any paragraph(s) of this summary, the machine or system further includes a controller operatively coupled to the mill and/or the chip placer, for controlling the mill and/or the chip placer.

According to an embodiment of any paragraph(s) of this summary, the machine or system further including a height sensor operatively coupled to the controller and the mill.

According to an embodiment of any paragraph(s) of this summary, the height sensor provides feedback to the controller to facilitate movement of the mill to remove material, prior to placement of the new flip chip.

According to an embodiment of any paragraph(s) of this summary, the height sensor is a laser height sensor.

According to an embodiment of any paragraph(s) of this summary, the machine is an automated machine capable of automatically milling using the mill, and placing using the placer.

According to yet another aspect of the invention, a method of reworking an underfilled flip chip mounted on an electronic device includes the steps of: milling away the flip chip and underfill around the flip chip; and following the milling, mounting a new flip chip in place of the flip chip that was removing by the milling; wherein the milling and the mounting are parts of an automated process.

According to still another aspect of the invention, a module for use in automated reworking includes: a mill; a controller operatively coupled to the mill; and an interface operatively coupled to the mill and/or the controller. The interface is configured to interface with a multi-function automated machine.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF DRAWINGS

The annexed drawings show various aspects of the invention.

DETAILED DESCRIPTION

A system and method for reworking a flip chip includes use of a mill to remove an old flip chip, and a pick-and-place device for putting a new flip chip in place at the same location. The process may be automated, with the removal and the placement occurring sequentially without need for operator intervention. Other devices and processes may be part of the system/machine and process, for example cleaning following the milling, fluxing prior to the placement, and heating to cause solder reflow, to secure the new flip chip in place. Underfill may be employed to make for a more mechanically robust mounting of the new flip chip.

Figure 1:
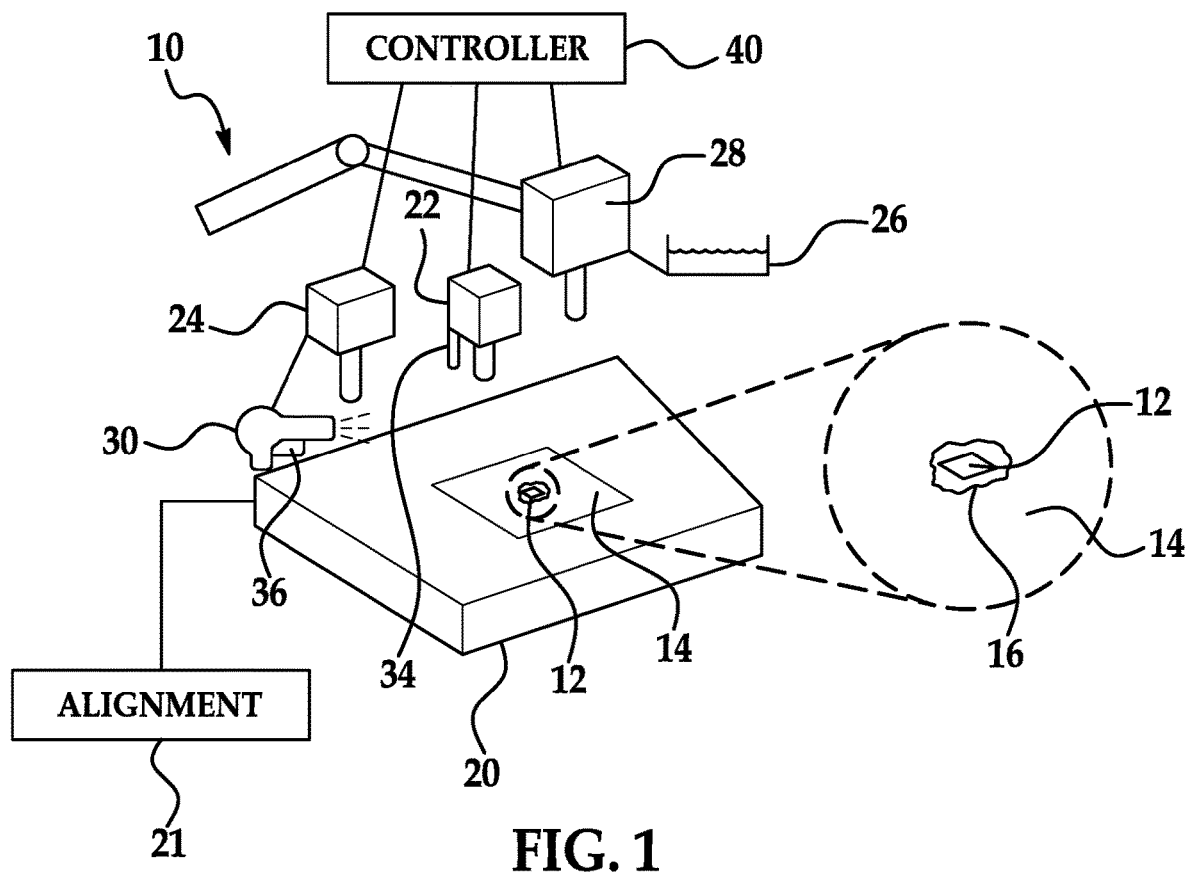
FIG. 1 is a schematic drawing of a reworking machine or device according to an embodiment of the invention.

FIG. 1 shows a machine or system (or device) 10 for reworking a semiconductor chip 12 that is coupled in a flip-chip configuration as part of an electronic device 14. A semiconductor chip that coupled in a flip-chip configuration is sometimes referred to herein as a flip chip. The electronic device 14 may be a substrate with conductive pads used to make electrical connection with the flip chip 12, for example using solder from solder balls initially on the bottom of contacts on the flip chip 12. The electronic device 14 may be any of a wide variety of boards, such as printed circuit boards, with various electrical and/or electronic components, used in any of a variety of devices. In one non-limiting example, the electronic device 14 may be a component of a radar system.

The machine or system 10 is used to rework the flip chip 12, removing the flip chip 12 and replacing it with another flip chip. The reworking may be prompted by a failure in operation (or connection) of the flip chip 12. It will be appreciated that the electronic device 14 may have a large number of chips and/or other components, and it would be undesirable to have to discard the entire electronic device 14 because of the failure of a single chip.

The flip chip 12 is an underfilled flip chip, meaning that the flip chip 12 is surrounded by an underfill 16, an electrically-insulating material that surrounds and secures the flip chip 12 in place. The underfill 16 also aids in relieving stresses on the flip chip 12, such as from thermal expansion or from mechanical stresses on the electronic device 14, such as flexures.

The machine or system 10 includes a platform or bed 20 for receiving the electronic device 14, with an aligner 21 for positioning the electronic device 14 in a desired location relative to other parts of the system 10; a mill 22 used for removing the flip chip 12 and the underfill 16; a cleaner 24 for cleaning up debris from the milling; a fluxer 26 for applying flux to solder balls of a replacement chip; a placer 28 for placing the new flip chip where the flip chip 12; and a heater 30 for providing local heating to reflow solder from the solder balls of the new flip chip, to make electrical connections with conductive pads on the electronic device 14.

The aligner 21 may be, for example, an alignment camera that is used for placing the device 14 in a desired location. The mill 22 may be used in conjunction with a laser height measurement system or other height sensor 34 used for controlling the height of the mill 22 above the bed 20, to precisely control the milling process, as described further below. The fluxer 26 may be a dip flux station. The heater 30 may be used in conjunction with a heat sensor 36, such as an infrared (IR) thermal management device or system, to control the amount of heating provided by the heater 30.

The various tools of the system 10 (the parts described in the previous two paragraphs) may be stored in a tool change rack (not shown). The system 10 may include a robot arm or other device for moving the tools relative to the bed 20, for example with movement in x-, y-, and z-directions, allowing three degrees of freedom. The machine or system 10 may also include additional parts that are not shown in FIG. 1. For example the system 10 may include a pick-and-place tray holder for holding replacement chips, prior to their placement by the placer 28, on the device 14

Operation of the some or all of the tools may be controlled by a controller 40. The controller 40 may be programmable, and may be capable of controlling operations specific to the reworking process. For example the controller 40 may be capable of controlling the milling process, using feedback from the height sensor to position the milling head of the mill 22. The controller 40 may also be configured to control other of the operations, such as pick-and-place operations and heating operations. In controlling such operations the controller 40 may receive feedback from various sensors or other parts of the system, such as the height sensor 34 for sensing height of the milling head above the bed or device substrate, and the temperature or heat sensor 36 used in controlling heating by the heater 30.

The controller 40 may be embodied in any of a variety of forms, such as processors, integrated circuits, or the like, and may be embodied as hardware and/or software.

Figure 2:
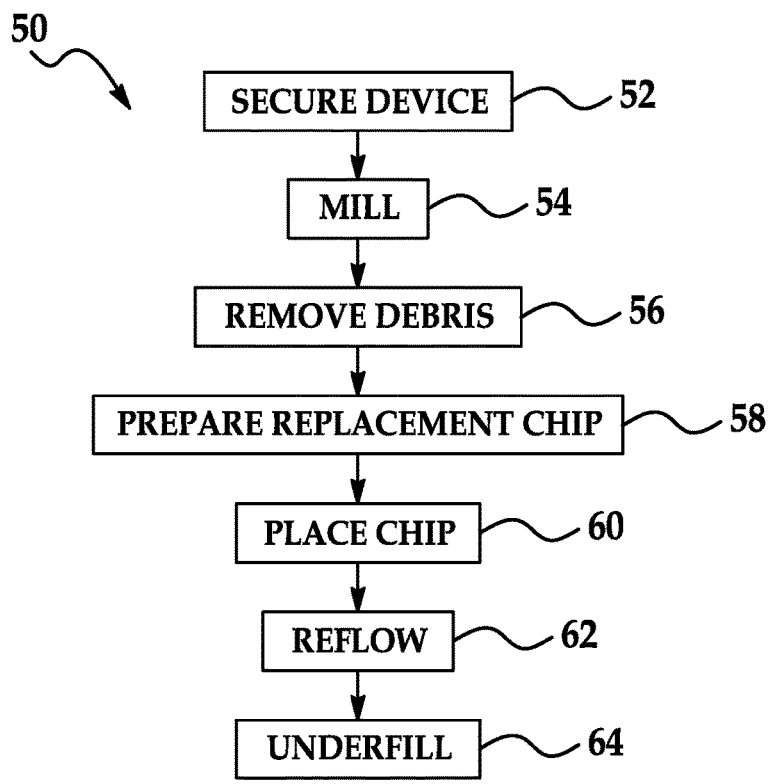
FIG. 2 is a high-level flow chart showing steps of a method of reworking that uses the machine or device of FIG. 1.
Figure 3:
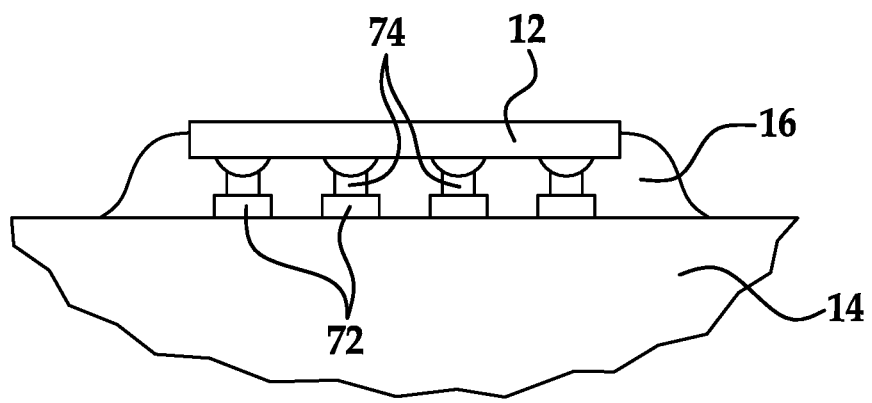
FIG. 3 illustrates one step of the method of FIG. 2.

FIG. 2 is a high-level flow chart of a method 50 of using the system 10 for reworking a flip chip. The method 50 begins in step 52 with the electronic device 14 (FIG. 1) being brought to the machine 10 (FIG. 1). The device 14 is secured to the platform or bed 20 and is aligned (using the aligner 21) as desired so as to work on an area of the device 14 where the flip chip 12 is located. The aligner 21 may include, for instance, motor(s) for moving the bed 20 relative to other parts of the machine 10. As shown in FIG. 3, the flip chip 12 is still in place during this step, with the flip chip 12 electrically coupled to conductive pads 72 of the device 14 with solder pillars 74, which were produced for example by reflowing solder from solder balls when the flip chip 12 was originally installed on or as part of the electronic device 14. The flip chip 12 is surrounded by the underfill 16.

Figure 4:
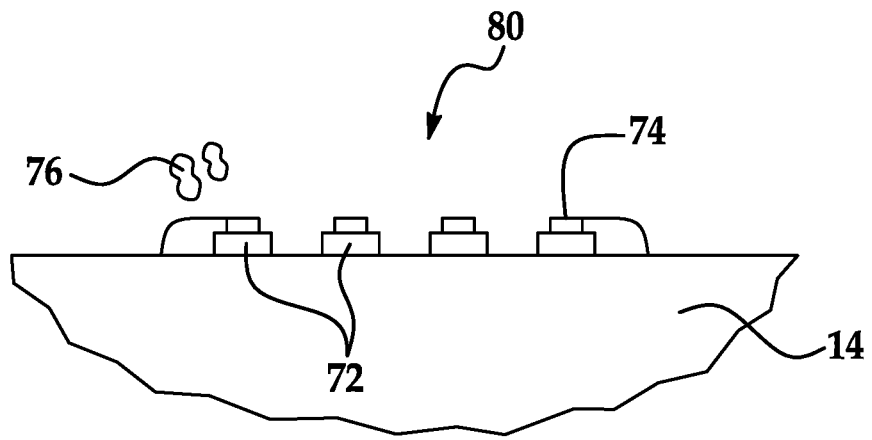
FIG. 4 illustrates another step of the method of FIG. 2.

In step 54 the flip chip 12 and the underfill 16 are removed by milling, as illustrated in FIG. 4. The mill 22 may be a high-precision mill, and height sensing is used to avoid milling too deeply. The height sensing may involve use of a laser height sensor, as described earlier. The mill 22 may be an end mill, or may perform an end milling operation. The goal in the milling is to remove the flip chip 12 and the underfill 16 without damaging the conductive pads 72. The milling may be done to a level of 1 mil above the tops of the conductive pads 72. This milling level may more broadly be 1-10 mils, or about 1 mil, for example 1 mil plus or minus 10%, or 20%, or 50%, or any percentage up to 50%, or another suitable percentage. The milling may leave portions of the solder pillars 74 exposed on top of the conductive pads 72. The milling process of step 52 may leave debris 76 in or near the milled area 80. This debris 76 may be removed in step 56 by a suitable process, such as by suctioning the debris 76 away using a cleaner or vacuum device 24.

Figure 5:
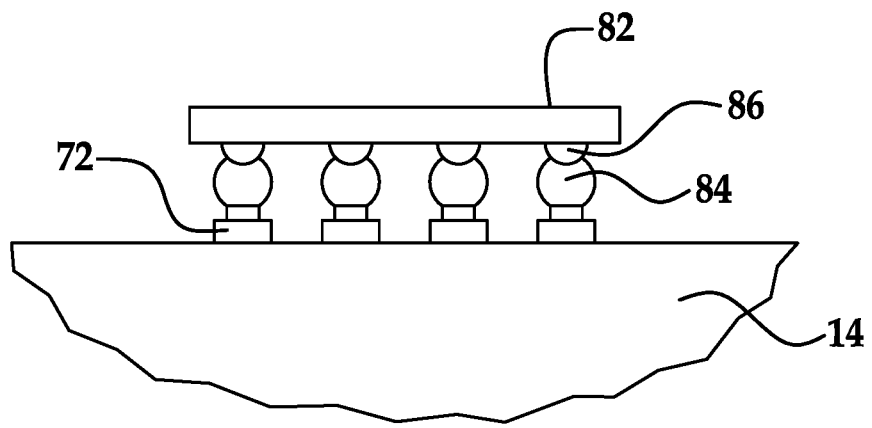
FIG. 5 illustrates yet another step of the method of FIG. 2.

In step 58 a replacement chip 82 (shown in FIG. 5) is prepared for installation, for example by having solder balls 84 attached to metalized bumps 86 of the chip 82, and by having flux applied to the solder balls 84, such as by a flux dip or other fluxer 26. Flux may also be applied at suitable locations within the milled area 80. In step 60 the replacement chip 82 is placed in the milled area 80 by a placer 28, such as a suitable pick-and-place device that uses suction to hold chips while they are transported to a suitable location, and put into place. The replacement chip 82 is placed to as to make suitable contact with the conductive pads 72 of the device 14.

Figure 6:
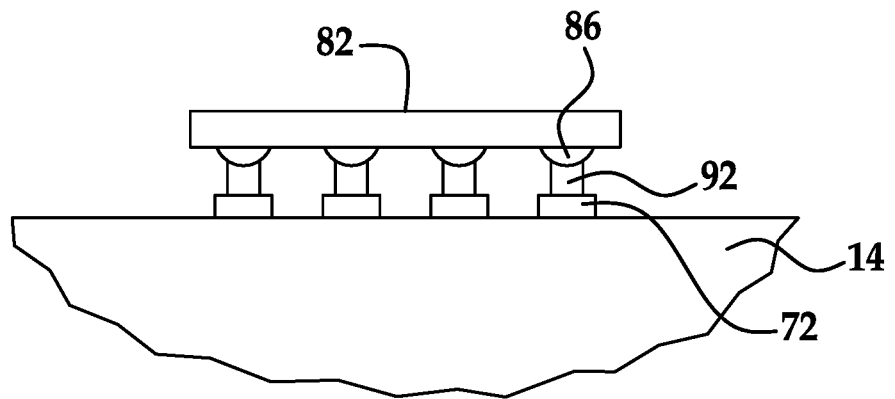
FIG. 6 illustrates a further step of the method of FIG. 2.

After placement of the replacement flip chip 82 solder reflow is initiated in step 62 by heating using the heater 30. The heater 30 may be any suitable device for applying localized heat to reflow the solder of the solder balls 86, to produce solder pillars 92 (FIG. 6) electrically connecting the conductive pads 72 of the device 14 to the metalized contacts 86 of the replacement chip 72. The heater 30 may use radiative heating or convection heating, such as by directing hot air, to give two non-limiting examples.

Some of the processes described above may be combined together using a single tool. For example the placer 24 may be used to move the replacement chip 82, before moving the replacement chip 82 to the device 14. As another example, the placer 24 may be combined with the heater 30 in a single tool, with the heating activated while the placer 24 is still holding the replacement chip 82.

Figure 7:
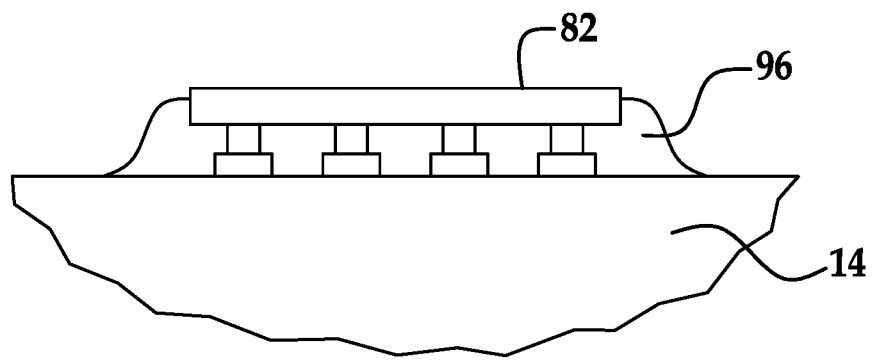
FIG. 7 illustrates a still further step of the method of FIG. 2.

Finally, in step 64 an underfill 96 is placed around the replacement flip chip 82. This step is illustrated in FIG. 7. The underfill 96 may be placed by the same methods, and may have the same function, as the original underfill 16 for the original flip chip 12.

It will be appreciated that the steps described above may be performed in a different order, where appropriate. For example, it may be possible to place the underfill before the heating/reflow step.

The machine or system 10 advantageously performs many of the steps of the method 50 in a single device. For example the milling, cleaning, placement, and reflow may all take place using a single device, with the electronic device 14 remaining secured in place on the platform or bed 20. The use of a specialized reworking device (machine cell) may reduce the time for reworking, and thereby reduce costs and/or improve efficiency. Many of the operations may be automated, reducing labor needs and improving results. As used herein, automation refers to performance of multiple operations, such as sequentially, without the need for action or intervention by an operator. Reworking time may be less than half that of prior methods, with reduced part scrapping, and the ability to rework parts that would previously have required scrapping.

Figure 8:
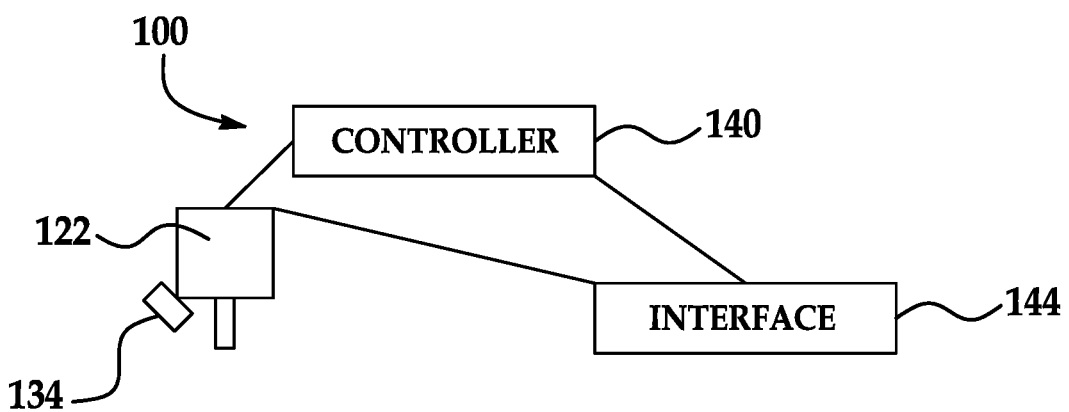
FIG. 8 is a schematic drawing of a module according to another embodiment of the invention.

Some of the components of the system 10 may be similar to those used in previous automation systems, for example in IC-production cells, such as the IC-900, IC-1200, or IC-1600, examples of INFOTECH AUTOMATION systems available through Air-Vac Automation. Such automation systems may be used microelectronics operations, being for example including high precision multi-functional position systems. With reference now to FIG. 8, some of the components of the system 10 may be in a module 100 that may be utilized by such systems, for example being an application-specific peripheral for use in reworking operations described herein. For example the module 100 may include a mill 122, a height sensor 134, a controller 140, and an interface 144 for interfacing with prior automation systems that are used for performing processes in an automated fashion. The mill 122, the height sensor 134, and the controller 140 may be similar to the mill 22 (FIG. 1), the sensor 34 (FIG. 1), and the controller 40 (FIG. 1). The interface 144 may include mechanical connections, electrical connections, or connections for operative control, such as for exchanging data and/or transmitting and/or receiving instructions, such as for controlling automated processes.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

What is claimed is:

1. A method of reworking an underfilled flip chip mounted on an electronic device, the method comprising:

milling away the flip chip and underfill around the flip chip; and following the milling, mounting a new flip chip in place of the flip chip that was removing by the milling;

wherein the milling and the mounting are parts of an automated process; and wherein the milling and the mounting are performed in a single machine or system.

2. The method of claim 1, wherein the milling makes available for mounting conductive pads of the electronic device.

3. The method of claim 1, wherein the milling uses an end mill.

4. The method of claim 1, wherein the milling comes within 1-10 mils of the conductive pads.

5. The method of claim 1, wherein the milling comes within 1 mil, or about 1 mil, of the conductive pads.

6. The method of claim 1, wherein the milling exposes solder on top of the conductive pads, wherein the exposed solder was used to electrically couple the original flip chip to the conductive pads.

7. The method of claim 1, wherein the milling removes conductive connections, such as solder, for example from solder balls, between the flip chip and the conductive pads.

8. The method of claim 1, wherein the mounting includes placing the new flip chip with a pick-and-place device.

9. The method of claim 1, further comprising, after the milling and before the mounting, removing debris created by the milling.

10. The method of claim 9, wherein the removing includes removing the debris by suction.

11. The method of claim 1, wherein the milling includes using a height sensor, operatively coupled to a mill, to control a depth of the milling.

12. The method of claim 11, wherein the height sensor includes a laser height sensor.

13. The method of claim 1, wherein the milling includes a robot arm moving the mill.

14. A method of reworking an underfilled flip chip mounted on an electronic device, the method comprising:

milling away the flip chip and underfill around the flip chip; and following the milling, mounting a new flip chip in place of the flip chip that was removing by the milling;

wherein the milling and the mounting are parts of an automated process; and further comprising, after the milling and before the mounting, removing debris created by the milling;

wherein the removing includes removing the debris by suction.

* * * * *